(12) United States Patent
Zhang

(10) Patent No.: US 7,420,792 B2
(45) Date of Patent: Sep. 2, 2008

(54) LINEAR CHARGER WHERE THE MATERIAL TEMPERATURE DIRECTLY AFFECTS THE CIRCUIT THERMAL CONTROL

(75) Inventor: Zhengwei Zhang, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 539 days.

(21) Appl. No.: 11/205,901

(22) Filed: Aug. 16, 2005

(65) Prior Publication Data

US 2007/0052461 A1    Mar. 8, 2007

(51) Int. Cl.
*H02H 5/04* (2006.01)
*H02H 3/00* (2006.01)
(52) U.S. Cl. .................................................. 361/103
(58) Field of Classification Search .................. 361/103

See application file for complete search history.

(56) References Cited

U.S. PATENT DOCUMENTS

| 3,796,943 | A | * | 3/1974 | Nelson et al. | 323/277 |
| 5,977,840 | A | * | 11/1999 | Connell et al. | 331/158 |
| 6,331,764 | B1 | * | 12/2001 | Oglesbee et al. | 320/136 |
| 6,600,641 | B2 | * | 7/2003 | Oglesbee et al. | 361/103 |
| 6,781,354 | B2 | * | 8/2004 | Zhang | 323/224 |

* cited by examiner

*Primary Examiner*—Ronald W Leja
(74) *Attorney, Agent, or Firm*—Perkins Coie LLP; Zhou Lu

(57) ABSTRACT

Methods and apparatus are disclosed for protecting circuits from damages caused by elevated temperatures. Presented embodiments illustrate IC thermal protection circuits that shut down power delivery circuits when the circuit temperature reaches a predefined upper threshold and restart the circuit when the circuit cools down to a predefined lower threshold. Other embodiments provide soft shutdown and soft restart, where not only the temperature range between the shutdown and the restart is predetermined, but also the time between the start of a shutdown process and the complete shutdown is controllable.

18 Claims, 4 Drawing Sheets

Soft Configuration

LINEAR CHARGER WHERE THE MATERIAL TEMPERATURE DIRECTLY AFFECTS THE CIRCUIT THERMAL CONTROL

TECHNICAL FIELD

The embodiments described below relate to thermal protection circuits and, in particular, to limiting the charger IC die temperature by soft shutdown and soft restart within a predetermined temperature range.

BACKGROUND

Thermal protection is a vital requirement for power delivery circuits and prevents permanent damage due to prolonged operation at excessive temperatures. In integrated circuits (ICs), especially in power ICs, power dissipation can cause relatively high temperatures. To avoid degradations phenomena when the circuit temperature rises, or in some cases destructive failures of ICs as a result of excessive temperature, it is usually critical to incorporate a dedicated protection circuit to switch off, at least, the power output portion of the integrated circuit and temporarily disable the primarily source of power dissipation.

A thermal protection circuit limits the maximum operation temperature of the power delivery circuit through a temporary thermal shutdown. It provides safeguard by sensing a temperature of the power delivery circuit and automatically shutting down the power delivery circuit, whenever the circuit temperature exceeds a predetermined threshold. A thermal protection circuit subsequently turns the circuit back on after the circuit cools off to a predetermined lower temperature.

The power delivery circuit may oscillate by being turned on and off through the thermal shutdown circuit; however, the frequency of such oscillation is reduced by incorporation of hysteresis in the form of a temperature "range," which separates the switch-off and the switch-on temperatures.

While the task of thermal protection circuits that are, for example, used in integrated power circuits is to switch off circuit components having a high dissipation power when a defined temperature threshold is exceeded, the abrupt on-off operations of the protection circuits can cause other damages to sensitive circuits or merely not be desirable for other reasons.

DETAILED DESCRIPTION

Various embodiments of the invention will now be described. The following description provides specific details for a thorough understanding and enabling description of these embodiments. One skilled in the art will understand, however, that the invention may be practiced without many of these details. Additionally, some well-known structures or functions may not be shown or described in detail, so as to avoid unnecessarily obscuring the relevant description of the various embodiments.

The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this Detailed Description section.

A linear battery charger IC can be overheated due to limited power dissipation through the package. The overheating is readily observed when a full charge current is supplied to a drained battery or when the input voltage of the charger is too high. To prevent damaging the charger, some sort of thermal protection is required. The embodiments described in this detailed description employ simple and effective methods and apparatus to limit die temperature when the IC consumes a lot of power. These embodiments illustrate thermal control mechanisms that limit the die temperature and prevent it from exceeding tolerable values.

The power dissipated in a charger IC can be expressed as:

$$I_{chg}(V_{in}-V_{batt}),$$

where $V_{in}$ is the input voltage to the charger, $V_{batt}$ is the momentary battery voltage during the charging process, $I_{chg}$ is the charge current, which is usually set to a constant proportional to a reference voltage, $V_{ref}$.

The die temperature increases when power increase is faster than the heat dissipation. Since heat dissipation is a function of ambient temperature, geometrical conduits for heat, component placement, component properties, etc, component die temperature will be uniquely defined. Therefore, where the rise in temperature directly affects a circuit, there is a need for the circuit to be able to adjust automatically, based on local parameters, and maintain a certain temperature range while continuing to perform its designed function.

In the disclosed embodiments, when a die temperature increases to a preset threshold, for example 120° C., the charge current $I_{chg}$ is turned off, allowing the IC to cool down. Subsequent to a shutdown and a cooling period, and after the IC temperature reaches a preset lower threshold, for example 110° C., the charge current is turned back on. By repeating these processes, even when $(V_{in}-V_{batt})$ is too high, the die temperature will be limited to a range of 110° C. to 120° C.

Figure 1:
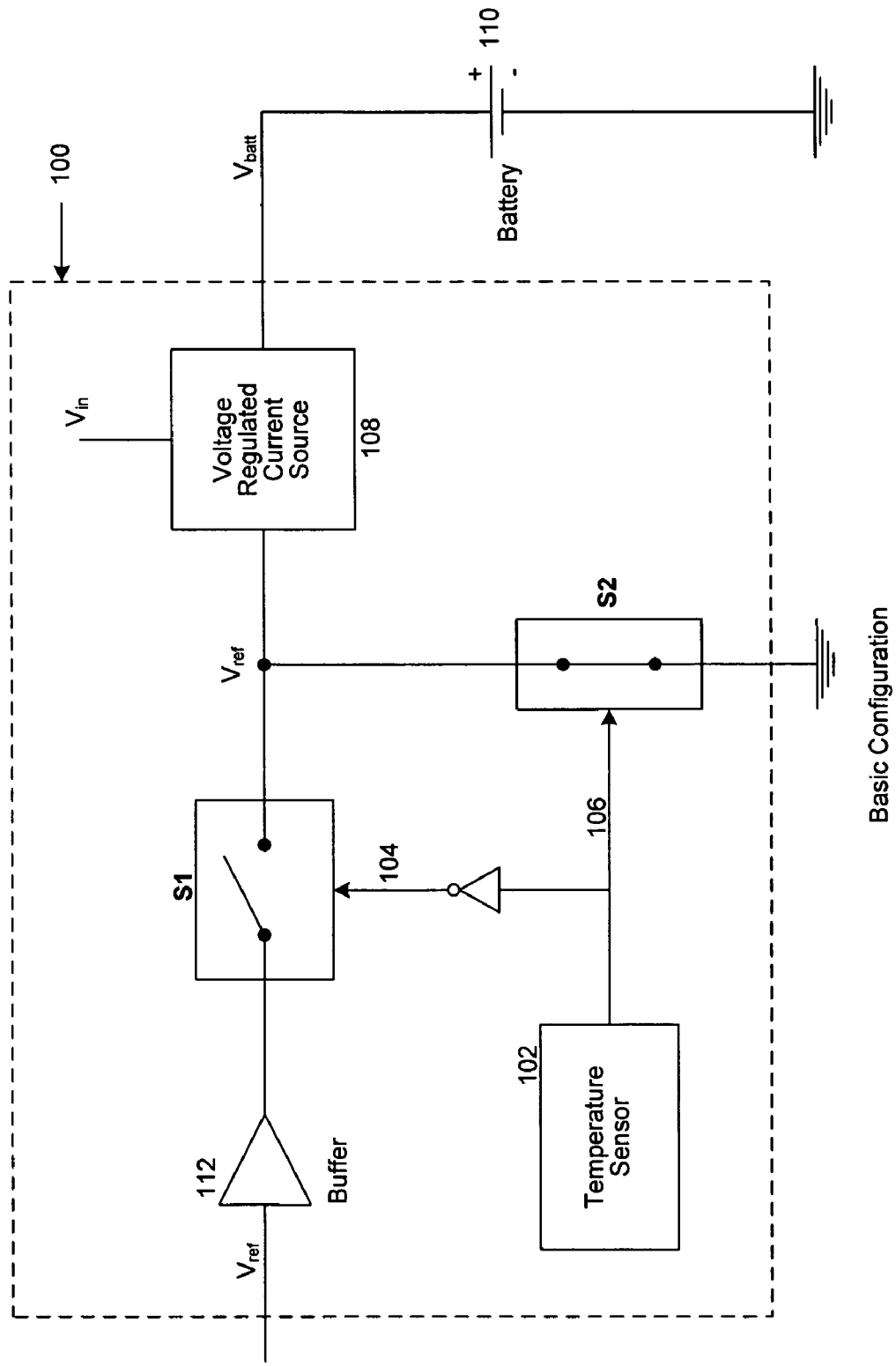
FIG. 1 is a schematic circuit diagram of a thermal protection circuit, in accordance with an embodiment of the invention.

FIG. 1 shows a simple circuit realization of the above mentioned method, wherein a reference voltage $V_{ref}$ controls the output current $I_{chg}$ of a voltage regulated current source 108 to charge a battery 110. In one embodiment, buffer 112 eliminates the loading effect of the circuit from the reference voltage source. In the following description, it is assumed that the voltage input and the voltage output of buffer 112 are the same, $V_{ref}$; however, they may be different in alternative embodiments without departing from the inventive aspects of other disclosed embodiments. It should also be noted that a linear voltage regulated current source is an idealization, and that the actual behavior of a voltage regulated current source is an approximation of such ideal voltage-current relationship.

Temperature is an analog quantity but digital systems often use temperature to implement measurement, control, and protection functions. Reading temperature with a microcontroller (μC) is simple in concept. The μC reads the output code of an analog-to-digital converter (ADC) driven by a thermistor-resistor voltage divider, analog-output temperature sensor, or other analog temperature sensors. However, when a sensor output voltage range is significantly smaller than the ADC input voltage range, such as when the number of µC I/O pins is limited or the ADC has insufficient inputs available, there is a need for linear temperature-to-code transfer function. In such cases altering the thermistor is not a practical solution option.

Another possible solution is to transmit temperature data directly to the µC. The sensors measure their die temperatures, and because die temperature closely tracks lead temperature, each sensor should be placed so that its leads assume the temperature of the component being monitored. In some cases, however, a temperature may not be tightly coupled to a sensor whose die is much hotter than the surrounding board. An internal temperature sensor may enable the ASIC to shut itself down in response to a temperature fault; however, this capability alone lacks accuracy and seldom warns the system of an impending thermal overload. By adding an externally accessible p-n junction to the ASIC die, it is possible to measure die temperature directly by forcing two or more different forward currents through the sensing junction and measuring the resulting voltages. The difference between the two voltages is proportional to the absolute die temperature:

$$V2 - V1 = \frac{kT}{q}\left(\ln\frac{I_2}{I_1}\right)$$

where $I_1$ and $I_2$ are the two currents forced through the p-n junction, V1 and V2 are the resulting forward voltages across the junction, k is Boltzmann's constant, T is the absolute temperature of the junction in degrees Kelvin, and q is the electron charge.

This measurement, of course, requires precision circuitry for generating the accurate current ratios and measuring very small voltage differences while rejecting the noise produced by large transients on the power ASIC die. Some solutions require a digital interface, therefore, adding complexity and cost to obtain the accuracy. These also require programming to adjust the necessary parameters for cooling. There is a need for a simple built-in circuit to control the local temperature and to regulate the function based on local thermal conditions and parameters, without undue ADC or µC costs.

In the exemplary embodiment illustrated in FIG. 1, $I_{chg}$ is proportional to the reference voltage $V_{ref}$. In an alternative embodiment the $I_{chg}$ and $V_{ref}$ may have a different relationship. When the temperature of the IC 100 reaches, for example, 120° C. the temperature sensor 102, using a switch control signal 104, opens switch S1 and, using a switch control signal 106, closes switch S2, and brings $V_{ref}$ down to 0 volt and, as a result, brings $I_{chg}$ also down to 0 Amp.

In a bipolar switch, there are typically two current paths through a transistor. The small base current controls the larger collector current. When the switch is closed, a small current flows into the base of the transistor. This causes a much larger current to flow through the emitter. The transistor amplifies this small current to allow a larger current to flow through from its collector (C) to its emitter (E). When the switch is open no base current flows, so the transistor switches off the collector current.

Since there are many different transistors, switches and switch characteristics can vary widely with the transistor characteristics. Moreover, other circuits and components can act as switches and are not precluded here. When a transistor is used as a switch it must be either off or fully on. In the fully on state the voltage $V_{CE}$ across the transistor is almost zero and the transistor is said to be saturated because it cannot pass any more collector current $I_C$. The output device switched by the transistor is usually called the "load." The important ratings in switching circuits are the maximum collector current $I_C$ (max) and the minimum current gain $h_{FE}$ (min). The transistor voltage ratings may be ignored unless using a supply voltage of more than about 15V. Transistors cannot switch AC or high voltages and they are not usually a good choice for switching large currents (>5A). In the embodiments of this invention, the currents contemplated meet these criteria. More recent solutions use MOSFET, CMOS, NPN, PNP, and/or other types of transistors.

By switching the charge current $I_{chg}$ off, the IC temperature starts to decrease towards the ambient temperature, which is assumed to be lower than the IC temperature. When the IC temperature reaches, for example 110° C., the temperature sensor 102, using the switch control signal 104, closes switch S1 and, using the switch control signal 106, opens switch S2, and as a result $V_{ref}$ and $I_{chg}$ resume their maximum/original values. In an alternative embodiment, a single control line may operate both switches S1 and S2.

Figure 3:
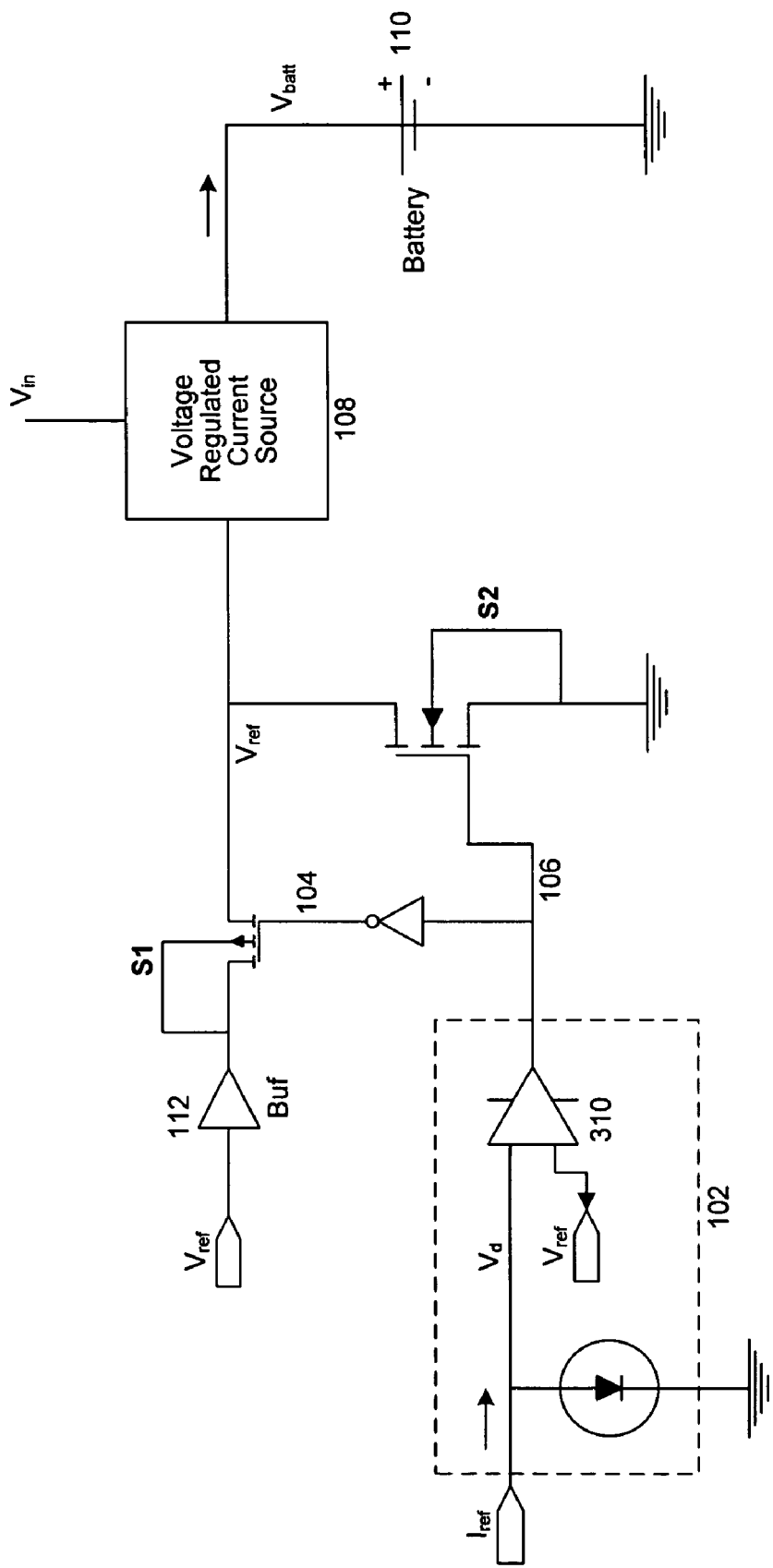
FIG. 3 illustrate an embodiment where switches are appropriately biased transistors.

As mentioned above, in an alternative embodiment S1 and S2 may be transistors. Such an embodiment is shown in FIG. 3, where the switches are appropriately biased transistors. In this embodiment, the reference current at $V_d$ is compared to the reference voltage $V_{ref}$ by comparator 310, to send a signal and control the switches when die temperature exceeds a set value. The components hysterisis characteristics can be utilized to form other embodiments and to control the switching signals.

Figure 2:
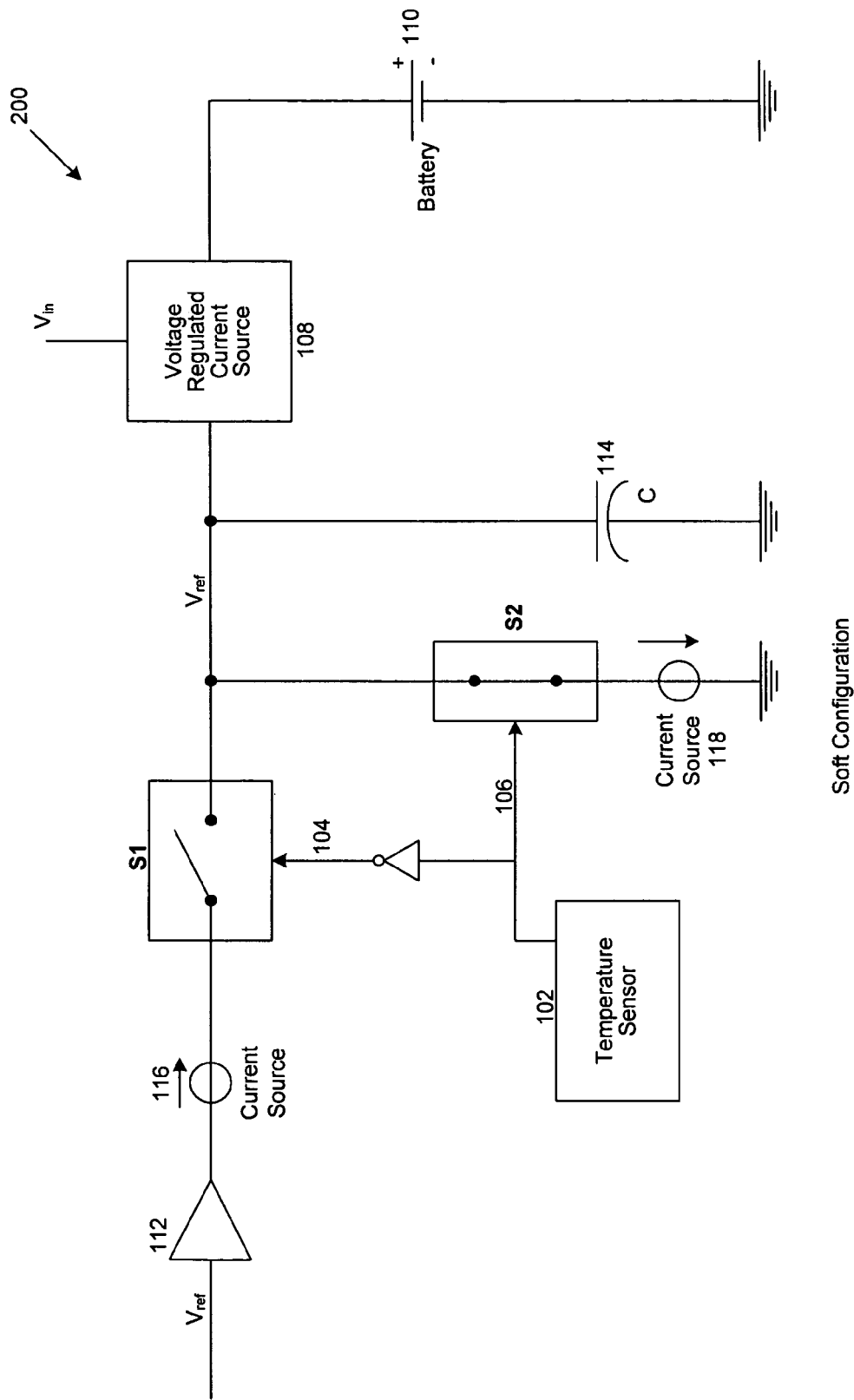
FIG. 2 is a schematic circuit diagram of a thermal protection circuit with soft shutdown and soft restart, in accordance with another embodiment of the invention.

In applications where an abrupt change in the charge current $I_{chg}$ is not desirable, the control mechanism can be modified to incorporate soft shutdown and soft restart. In one embodiment, illustrated in FIG. 2, reference voltage to the voltage regulated current source 108 is coupled with a capacitor 114, and current sources 116 and 118 are added in series with switches S1 and S2, respectively. In this embodiment 200 the rising and falling rate of $V_{ref}$ is controlled by the combination of the current sources 116 and 118 and capacitor 114, wherein:

$$d(I_{chg})dt \propto d(V_{ref})/dt = I/C.$$

In embodiment 200, when the IC temperature reaches, for example 110° C., the temperature sensor 102, using the switch control signal 104, closes switch S1 and, using the switch control signal 106, opens switch S2. As a result the output of the current source 116 becomes connected to the input of the voltage regulated current source 108; however, the reference voltage at the input of the voltage regulated current source 108, momentarily, is equal to the voltage of capacitor 114 which keeps rising as it continues storing the current from the current source 116.

Popular current mirrors are widely used as current sources. An ideal current source has infinite output impedance. That is, the output current does not change, even for large swings in output voltage, or in other words, $\Delta I/\Delta V=0$. A simple bipolar current mirror has two identical transistors, where the second transistor mirrors the current in the first. The current voltage relationship for a bipolar transistor is:

$$Ic=Is*e^{Vbe/Vt}$$

where the saturation current $I_s$ is a constant. $V_{be}$ is the base emitter voltage and $V_t$ is the thermal voltage. KT/q=25.8 mV at room temperature.

Identical transistors have the same $I_s$. In a simple current mirror, both transistors have the same Vbe, therefore, both transistors will have the same $I_c$. If base currents are ignored, $I_{ref}=I_o$. Therefore, while the voltage of capacitor 114 rises so does the reference voltage to the voltage regulated current source 108 and, consequently, so does $I_{chg}$, until the reference voltage approaches its maximum potential. As mentioned above, the rise time of $V_{ref}$ and $I_{chg}$ is controllable and provides a soft restart.

In embodiment 200, when the die temperature decreases to a preset threshold, for example 120° C., the temperature sensor 102, using switch control signal 104, opens switch S1 and, using a switch control signal 106, closes switch S2 and, in a controlled time period, brings $V_{ref}$ down to 0 volt and, as a result brings $I_{chg}$ also down to 0 Amp. Once S1 is opened and S2 is closed, the reference voltage at the input of the voltage regulated current source 108 will follow the voltage of capacitor 114, which has risen to $V_{ref}$ during the charging process, while the temperature has been under 120° C.

It will take some time for the capacitor 114 to drain its charge through current limiting source 118, and to lower the reference voltage of the voltage regulated current source 108. Therefore, as the voltage of capacitor 114 drops so does the reference voltage to the voltage regulated current source 108 and, consequently, so does $I_{chg}$, until the reference voltage approaches 0 volt and $I_{chg}$ approaches 0 Amp. Therefore, as mentioned above, the fall time of $V_{ref}$ and $I_{chg}$ is controllable and provides a soft shutdown.

In this configuration the IC temperature remains between the two predetermined temperatures, for example 110° C. and 120° C., without abrupt on-off switching. Also, in embodiment 200, buffer 112 eliminates the loading effect of the circuit from the reference voltage source. In an alternative embodiment, a single control line may operate both switches S1 and S2. Again, in some IC embodiments of the circuit, S1 and S2 may be transistors.

Figure 4:
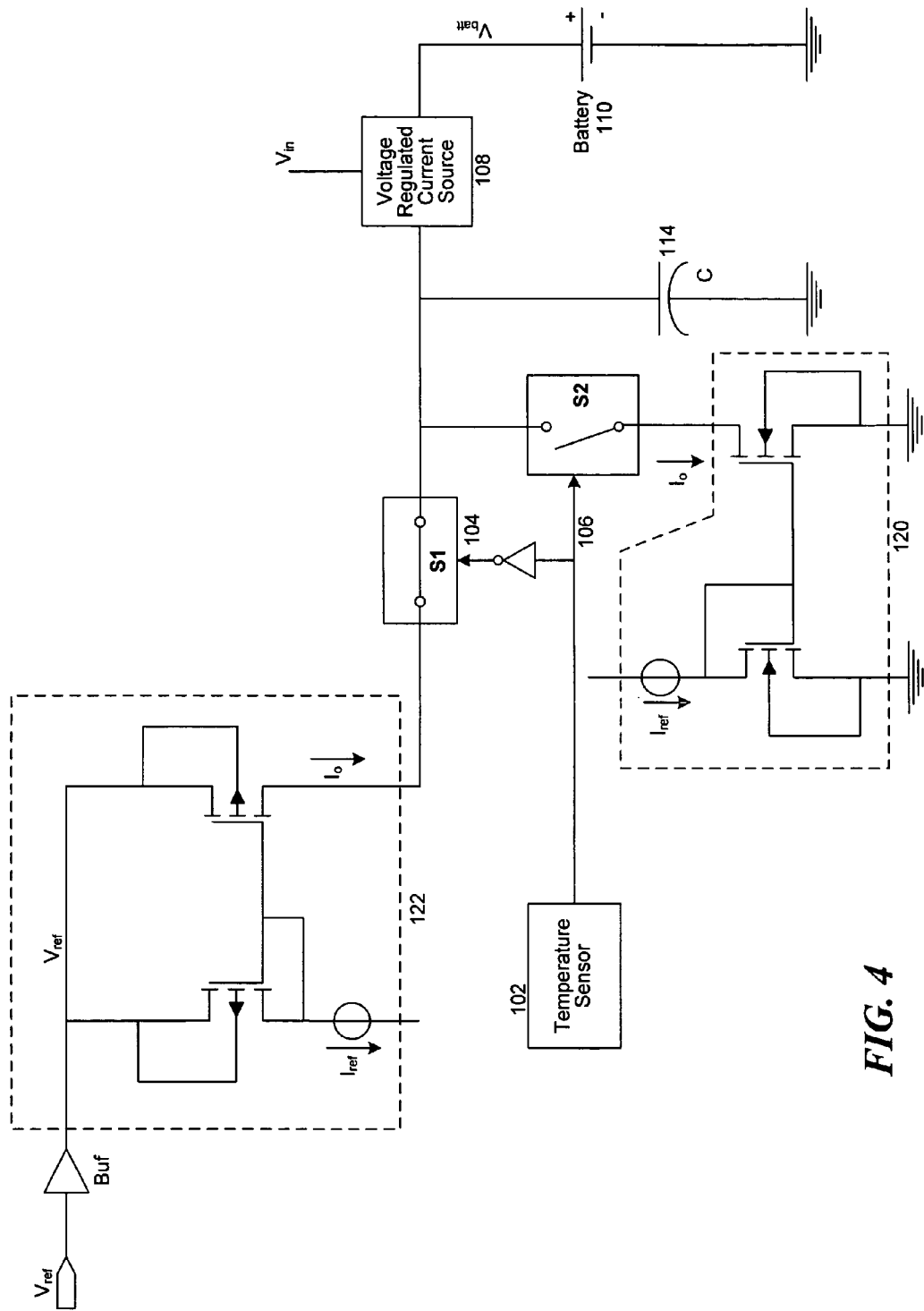
FIG. 4 illustrates a temperature independent current source using a current mirror configuration in conjunction with one of the switches.

FIG. 4 illustrates an embodiment with two temperature independent current sources that use two current mirror configurations 120 and 122 in conjunction with S2 and S1, respectively. In an alternative embodiment only one of the current sources may be implemented by using a current mirror that employs bipolar FETs.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof.

Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

The teachings of the invention provided herein can be applied to other systems, not necessarily the system described above. The elements and acts of the various embodiments described above can be combined to provide further embodiments.

Changes can be made to the invention in light of the above Detailed Description. While the above description describes certain embodiments of the invention, and describes the best mode contemplated, no matter how detailed the above appears in text, the invention can be practiced in many ways. Details of the compensation system described above may vary considerably in its implementation details, while still being encompassed by the invention disclosed herein.

As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

I claim:

1. A thermal protection circuit for an integrated circuit (IC) battery charger, the circuit comprising:
    a voltage regulated current source;
    an input reference voltage port for connecting to a voltage reference source to regulate an output current of the voltage regulated current source;
    a temperature sensor generating control signals at least in relation with a first predetermined temperature and a second predetermined temperature that is lower than the first temperature;
    a first controllable switch connecting the reference voltage port to an input of the voltage regulated current source, wherein the first switch opens by a control signal indicating a temperature at or above the first predetermined temperature and closes by a control signal indicating a temperature at or below the second predetermined temperature, and wherein at or below the second predetermined temperature the input of the voltage regulated current source reference input is connected to the input reference voltage; and
    a second controllable switch connecting the input of the voltage regulated current source to ground, wherein the second switch closes by a control signal indicating a temperature at or above the first predetermined temperature and opens by a control signal indicating a temperature at or below the second predetermined temperature, and wherein at or above the first predetermined temperature the input of the voltage regulated current source is connected to ground.

2. The circuit of claim 1, wherein a buffer is added between the input reference voltage port and the first switch.

3. The circuit of claim 1, wherein the first, the second, or both controllable switches are transistors.

4. The circuit of claim 1, wherein the temperature sensor is a voltage comparator, comparing the reference voltage and a voltage of a reference current, and wherein the temperature sensor outputs a switch control signal.

5. The circuit of claim 4, wherein the reference current is produced by a current mirror.

6. A temperature limiting power delivery integrated circuit (IC), comprising:
   a voltage regulated current source;
   an input reference voltage port for connecting a voltage reference source to regulate an output current of the voltage regulated current source;
   a temperature sensor generating control signals at least in relation with a first predetermined temperature and a second predetermined temperature that is lower than the first temperature;
   a first regulating switch, located between the reference voltage port and an input of the voltage regulated current source, wherein the first switch opens by a control signal indicating a temperature at or above the first predetermined temperature and closes by a control signal indicating a temperature at or below the second predetermined temperature;
   a first current source located between the first regulating switch and the input reference voltage port for regulating a current through the first switch;
   a capacitor connected between the input of the voltage regulated current source and ground;
   a second regulating switch located between the input of the voltage regulated current source and ground, wherein the second switch closes by a control signal indicating a temperature at or above the first predetermined temperature and opens by a control signal indicating a temperature at or below the second predetermined temperature; and
   a second current source connected between the second regulating switch and ground for regulating a rate of discharge of the capacitor.

7. The circuit of claim 6, wherein a buffer is added between the input reference voltage port and the first switch.

8. The circuit of claim 6, wherein the first, the second, or both regulating switches are transistors.

9. The circuit of claim 6, wherein at least one current source is a current mirror.

10. The circuit of claim 6, wherein the temperature sensor is a voltage comparator, comparing the reference voltage and a voltage of a reference current, and wherein the temperature sensor outputs a switch control signal.

11. A method of power delivery while limiting temperature rise in an integrated power delivery circuit, the method comprising:
   generating a voltage controlled current output by a voltage regulated current source;
   sensing a temperature of the circuit;
   generating control signals related at least to a first predetermined temperature and a second predetermined temperature, wherein the first predetermined temperature is higher than the second predetermined temperature;
   connecting an input reference voltage to an input of the voltage regulated current source by a control signal indicating a temperature at or below the second predetermined temperature, wherein subsequent to connecting the input reference voltage to the input of the voltage regulated current source the reference voltage rise time, as seen by the voltage regulated current source input, is regulated; and
   disconnecting the input reference voltage from the input of the voltage regulated current source by a control signal indicating a temperature at or higher than the first predetermined temperature, wherein subsequent to disconnecting the input reference voltage from the input of the voltage regulated current source the reference voltage fall time, as seen by the voltage regulated current source input, is regulated.

12. The method of claim 11, wherein the input reference voltage is buffered from rest of the circuit.

13. The method of claim 11, wherein connecting to and disconnecting from the input reference voltage is implemented by Bipolar, FET, MOSFET, CMOS, NPN, PNP, or a combination of listed transistors.

14. The method of claim 11, wherein the temperature is sensed using a voltage comparator that compares the reference voltage and a voltage of a reference current.

15. The method of claim 11, wherein the rise and the fall times of the reference voltage, as seen by the current source input, are regulated using a current source, a capacitor, or a combination thereof.

16. The method of claim 15, wherein the current source is a current mirror.

17. A method of power delivery while regulating die temperature of an integrated power delivery circuit, the method comprising:
   means for generating a voltage controlled current output by a voltage regulated current source;
   means for sensing a temperature of the circuit;
   means for generating control signals related at least to a first predetermined temperature and a second predetermined temperature, wherein the first predetermined temperature is higher than the second predetermined temperature;
   means for connecting an input reference voltage to an input of the voltage regulated current source by a control signal indicating a temperature at or below the second predetermined temperature, wherein subsequent to connecting the input reference voltage to the input of the voltage regulated current source the reference voltage rise time, as seen by the current source input, is regulated; and
   means for disconnecting the input reference voltage from the input of the voltage regulated current source by a control signal indicating a temperature at or higher than the first predetermined temperature, wherein subsequent to disconnecting the input reference voltage from the input of the voltage regulated current source the reference voltage fall time, as seen by the current source input, is regulated.

18. The method of claim 17, wherein the means for sensing temperature is a thermistor-resistor voltage divider or an analog temperature sensor.

* * * * *